(12) United States Patent
Tan et al.

(10) Patent No.: US 9,997,366 B2
(45) Date of Patent: Jun. 12, 2018

(54) SILICON OXIDE SILICON NITRIDE STACK ION-ASSISTED ETCH (71) Applicant: Lam Research Corporation, Fremont, CA (US)

(72) Inventors: Zhongkui Tan, San Jose, CA (US); Hua Xiang, Pleasanton, CA (US); Wenbing Hu, San Jose, CA (US); Qing Xu, Fremont, CA (US); Qian Fu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/726,120

(22) Filed: Oct. 5, 2017

(65) Prior Publication Data
US 2018/0108532 A1 Apr. 19, 2018

Related U.S. Application Data (60) Provisional application No. 62/410,225, filed on Oct. 19, 2016.

(51) Int. Cl.
H01L 21/302 (2006.01)
H01L 21/461 (2006.01)
H01L 21/3065 (2006.01)
H01L 21/02 (2006.01)
C01B 21/068 (2006.01)
C01B 33/113 (2006.01)

(52) U.S. Cl.
CPC .... H01L 21/3065 (2013.01); H01L 21/02019 (2013.01); *C01B 21/068* (2013.01); *C01B 33/113* (2013.01)

(58) Field of Classification Search
USPC .................................................. 438/706
See application file for complete search history.

(56) References Cited

U.S. PATENT DOCUMENTS 8,598,040 B2 * 12/2013 Le Gouil ............ H01L 21/3065
438/714

* cited by examiner

Primary Examiner — Roberts Culbert
(74) Attorney, Agent, or Firm — Beyer Law Group LLP (57) ABSTRACT A method for ion-assisted etching a stack of alternating silicon oxide and silicon nitride layers in an etch chamber is provided. An etch gas comprising a fluorine component, helium, and a fluorohydrocarbon or hydrocarbon is flowed into the etch chamber. The gas is formed into an in-situ plasma in the etch chamber. A bias of about 10 to about 100 volts is provided to accelerate helium ions to the stack and activate a surface of the stack to form an activated surface for ion-assisted etching, wherein the in-situ plasma etches the activated surface of the stack.

16 Claims, 6 Drawing Sheets

SILICON OXIDE SILICON NITRIDE STACK ION-ASSISTED ETCH

CROSS REFERENCE TO RELATED APPLICATION

This application claims the benefit of priority of U.S. Provisional Application No. 62/410,225, filed Oct. 19, 2016, which is incorporated herein by reference for all purposes.

BACKGROUND

The present disclosure relates to the formation of semiconductor devices. More specifically, the disclosure relates to the formation of stair-step semiconductor devices.

During semiconductor wafer processing, stair-step features are sometimes required. For example, in 3D flash memory devices, multiple cells are stacked up together in chain format to save space and increase packing density. The stair-step structure allows electrical contact with every gate layer. Such stair-step structures may be formed by a plurality of alternating layers of silicon oxide and silicon nitride, where such stacks are designated as ONON stacks. ONON stacks may also be used to form other semiconductor devices in addition to stair-step semiconductor devices.

SUMMARY

To achieve the foregoing and in accordance with the purpose of the present disclosure, a method for ion-assisted etching a stack of alternating silicon oxide and silicon nitride layers in an etch chamber is provided. An etch gas comprising a fluorine component, helium, and a fluorohydrocarbon or hydrocarbon is flowed into the etch chamber. The gas is formed into an in-situ plasma in the etch chamber. A bias of about 10 to about 100 volts is provided to accelerate helium ions to the stack and a activate a surface of the stack to form an activate surface of the stack for ion-assisted etching, wherein the in-situ plasma etches the activated surface of the stack.

In another manifestation, a method for forming a stair-step structure in a stack in a plasma processing chamber is provided, wherein the stack has an organic mask and wherein the stack comprises a plurality of bilayers of silicon oxide and silicon nitride, comprising a plurality of cycles, wherein each cycle comprises trimming the organic mask and ion-assisted etching at least one complete bilayer of the stack. The ion-assisted etching comprises flowing an etch gas comprising a fluorine component, helium, and a fluorohydrocarbon or hydrocarbon into an etch chamber, forming the etch gas into an in-situ plasma in the etch chamber, and providing bias of about 10 to about 100 volts to accelerate helium ions to the stack in the etch chamber and activate a surface of the stack to form an activated surface of the stack, wherein the in-situ plasma etches the activated surface of the stack.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
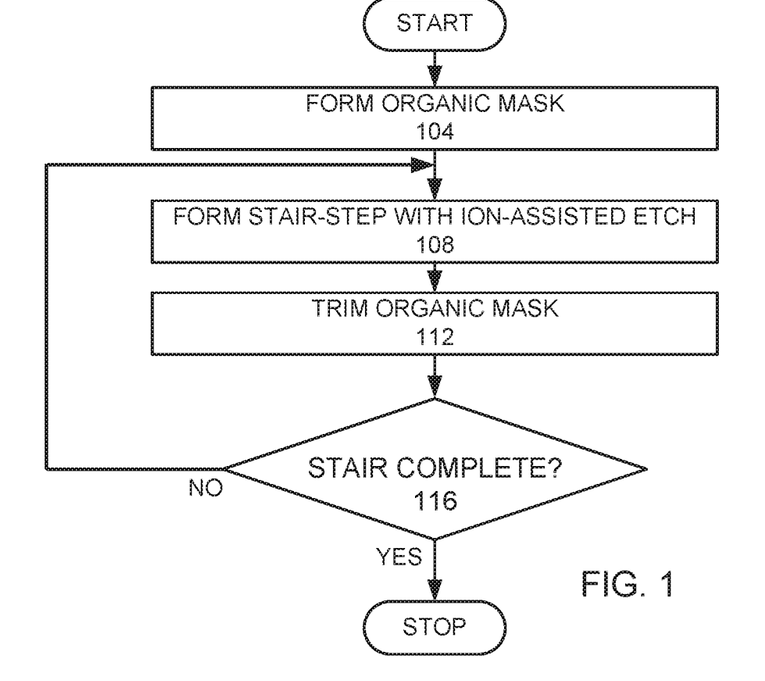
FIG. 1 is a high level flow chart of a process that may be used in an embodiment of the disclosure.

To facilitate understanding, FIG. 1 is a high level flow chart of a process that may be used in an embodiment of the disclosure, which forms a stair-step structure in a stack. An organic mask is formed over a stack of alternating silicon oxide and silicon nitride (ONON) layers (step 104). A stair-step structure is formed with an ion-assisted etch (step 108). The organic mask is trimmed (step 112). If the etch of the stair-step is not complete (step 116), then the process goes to the ion-assisted etching stair-step formation step (step 108). Otherwise, the process is complete and other steps may be performed.

Figure 2:
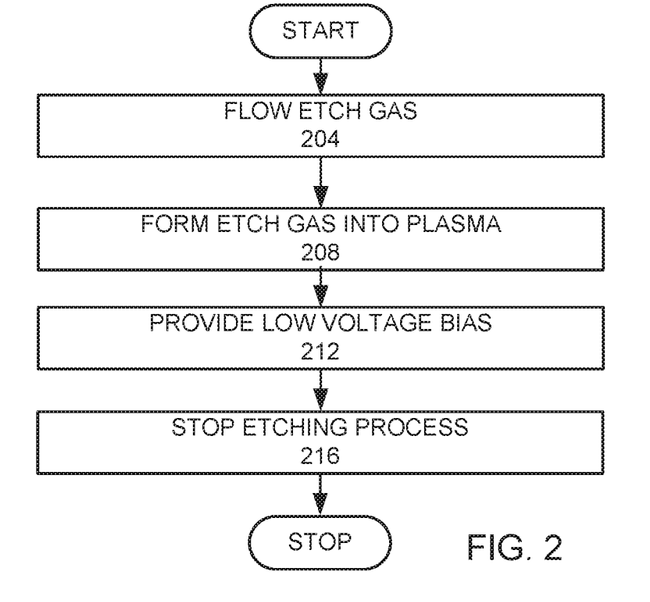
FIG. 2 is a more detailed flow chart of step 108 in FIG. 1 on using ion-assisted etch to form a stair-step structure.

FIG. 2 is a more detailed flow chart of the step of forming a stair-step structure using an ion-assisted etch. An etch gas is flowed into a processing chamber (step 204), wherein the etch gas comprises a fluorine containing component, helium, and a hydrofluorocarbon or a fluorocarbon component. The etch gas is formed into a plasma inside the plasma chamber (step 208). A low bias of 10 to 100 volts is provided to cause ion bombardment from helium ions to activate a surface of the stack for ion-assisted etching, wherein the plasma etches the activated surface of the stack (step 212). The ion-assisted etch process is stopped (step 216).

EXAMPLE

Figure 3A:
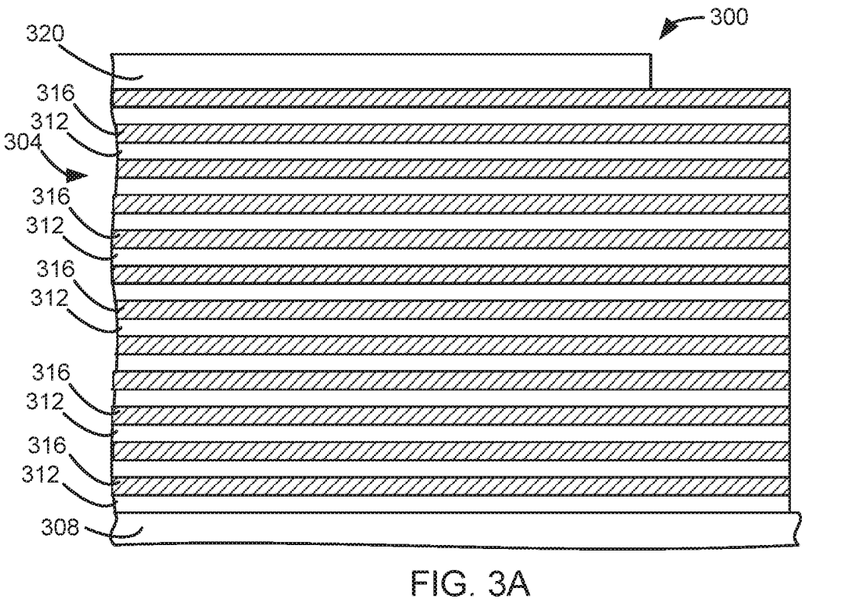
FIGS. 3A-F are schematic cross-sectional views of a stack etched according to an embodiment of the disclosure.

In an example of an implementation of the disclosure, a stair-step memory array is etched. In such a memory array, memory stacks are formed over a wafer. FIG. 3A is a cross sectional view of a stack 300 comprising a plurality of layers of memory stacks 304 formed over a wafer 308. In this embodiment, each memory stack of the plurality of memory stacks is formed by bilayers of a layer of silicon oxide ($SiO_2$) 316 on top of a layer of silicon nitride (SiN) 312 forming an ONON stack. An organic mask 320 is formed over the memory stacks 304 (step 104). The organic mask may be a photoresist mask that is formed using a spin on process and a photolithographic patterning. In the alternative, the organic mask may be a spun on or otherwise applied organic layer, without photolithographic patterning.

Figure 4:
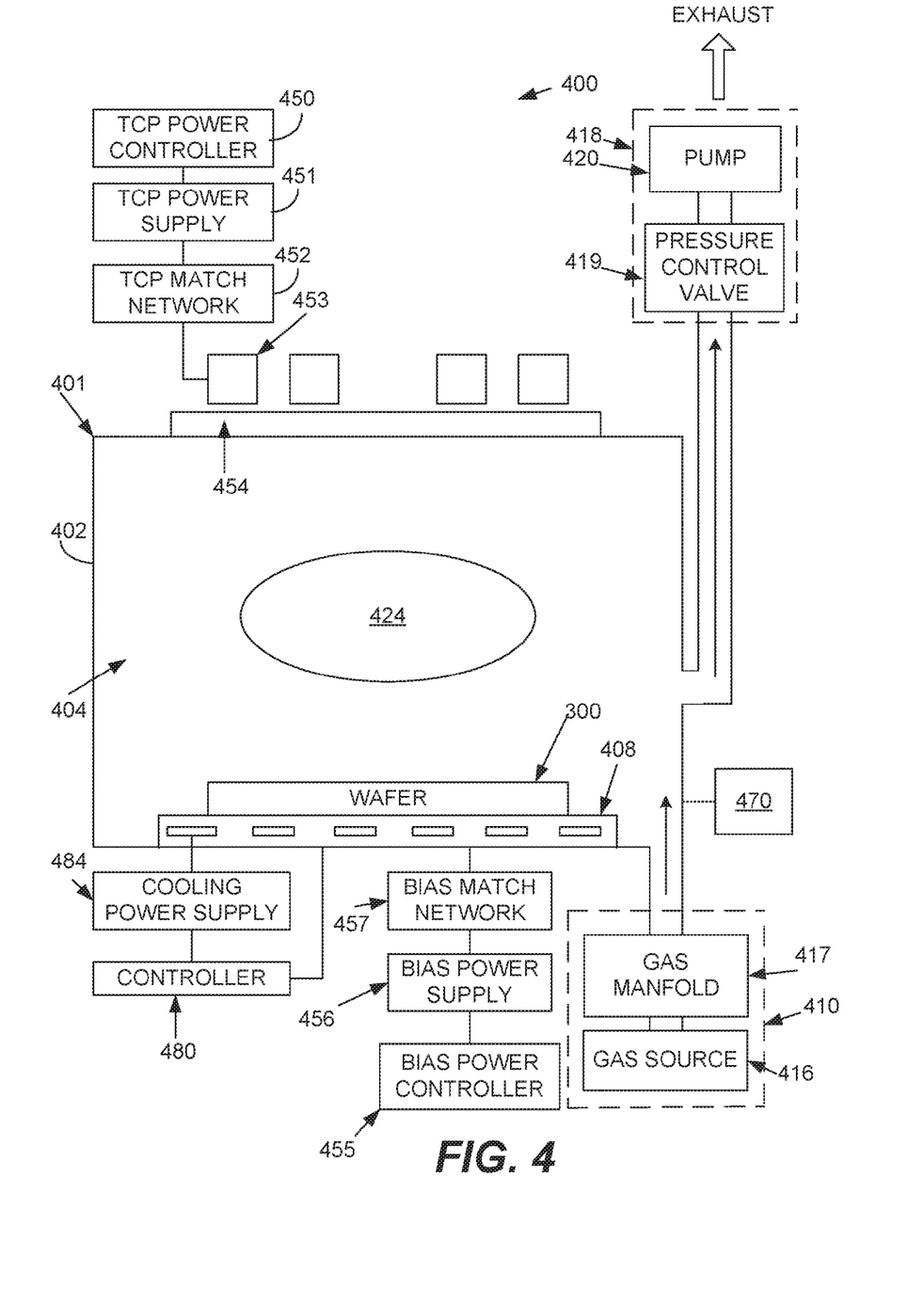
FIG. 4 is a schematic view of a plasma processing chamber that may be used in practicing the disclosure.

The stack 300 may be placed in a processing tool to perform subsequent steps. FIG. 4 illustrates a processing tool that may be used in an implementation of the disclosure. FIG. 4 is a schematic view of a plasma processing system 400, including a plasma processing tool 401. The plasma processing tool 401 is an inductively coupled plasma etching tool and includes a plasma reactor 402 having a plasma processing chamber 404 therein. A transformer coupled power (TCP) controller 450 and a bias power controller 455, respectively, control a TCP power supply 451 and a bias power supply 456 influencing the plasma 424 created within plasma chamber 404.

The TCP power controller 450 sets a set point for TCP power supply 451 configured to supply a radio frequency signal at 13.56 MHz, tuned by a TCP match network 452, to a TCP coil 453 located near the plasma chamber 404. An RF transparent window 454 is provided to separate TCP coil 453 from plasma chamber 404, while allowing energy to pass from TCP coil 453 to plasma chamber 404.

The bias power controller 455 sets a set point for bias power supply 456 configured to supply an RF signal, tuned by bias match network 457, to a chuck electrode 408 located within the plasma chamber 404 creating a direct current (DC) bias above electrode 408 which is adapted to receive the stack 300.

A gas supply mechanism or gas source 410 includes a source or sources of gas or gases 416 attached via a gas manifold 417 to supply the proper chemistry required for the process to the interior of the plasma chamber 404. A gas exhaust mechanism 418 includes a pressure control valve 419 and exhaust pump 420 and removes particles from within the plasma chamber 404 and maintains a particular pressure within plasma chamber 404.

A temperature controller 480 controls the temperature of a cooling recirculation system provided within the chuck electrode 408 by controlling a cooling power supply 484. The plasma processing system also includes electronic control circuitry 470. The plasma processing system may also have an end point detector. An example of such an inductively coupled plasma processing chamber is the Kiyo built by Lam Research Corporation of Fremont, Calif., which is used to etch silicon, polysilicon and conductive layers, in addition to dielectric and organic materials. In other embodiments of the disclosure, a capacitively coupled system may be used.

Figure 5:
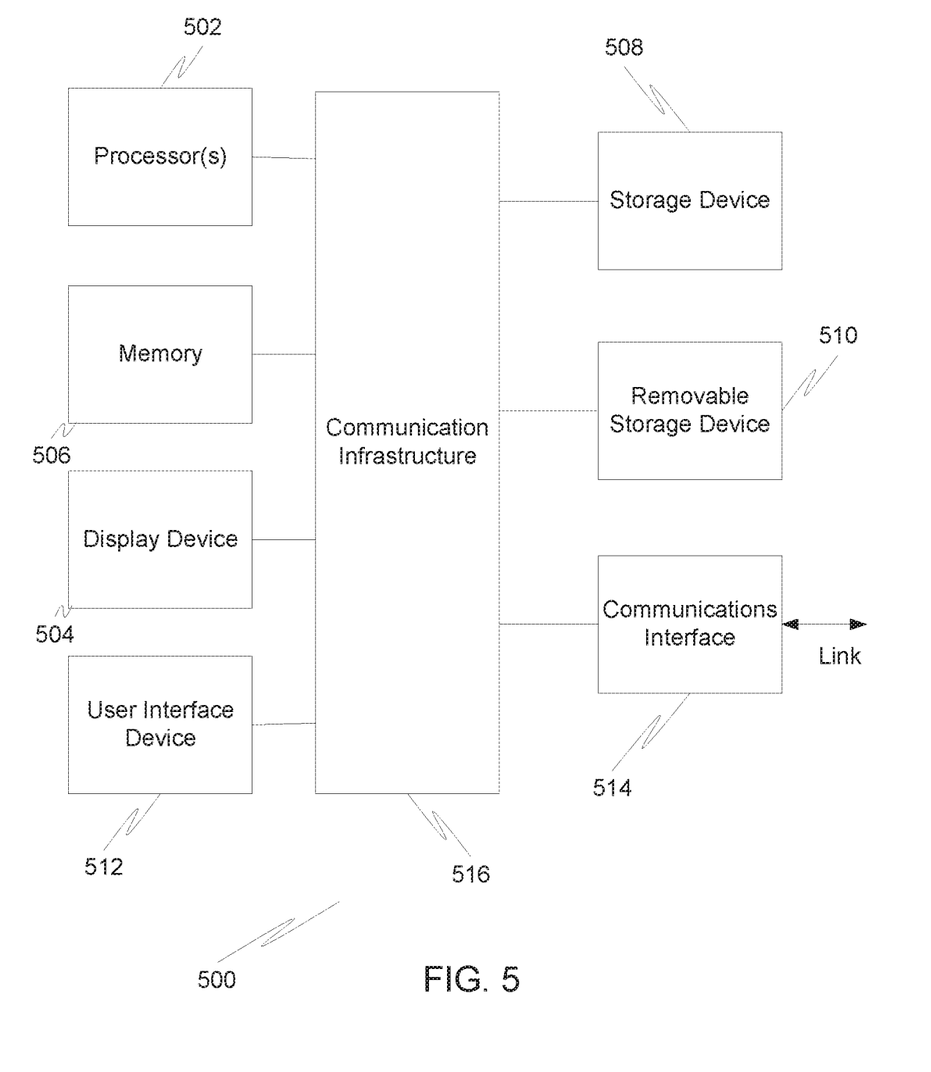
FIG. 5 illustrates a computer system, which is suitable for implementing a controller used in embodiments of the present disclosure.

FIG. 5 is a high level block diagram showing a computer system 500, which is suitable for implementing a control circuitry 470 used in embodiments of the present disclosure. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present disclosure may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3B:
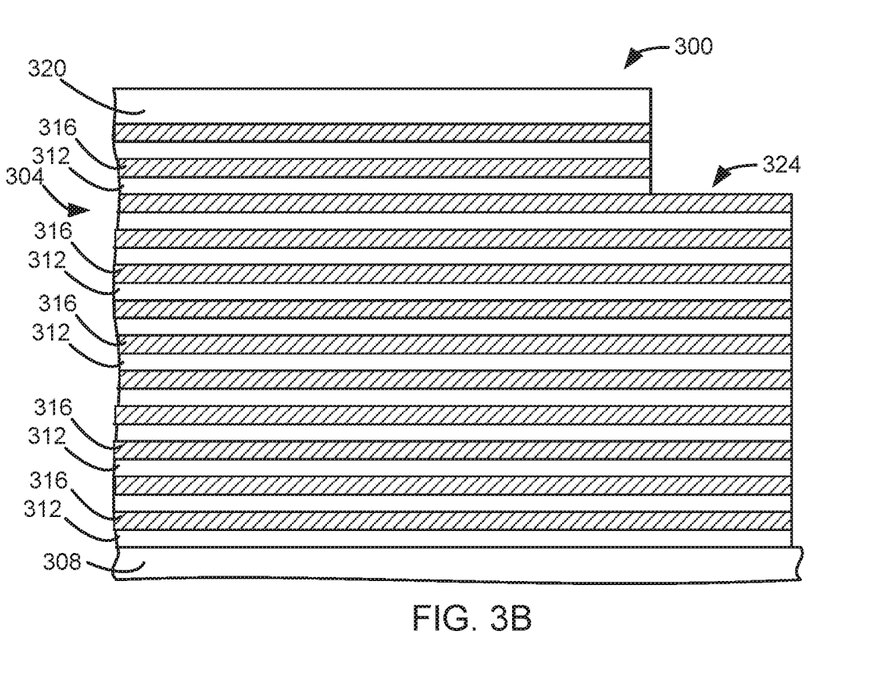

In this example, a stair step is ion-assisted etched (step 108). An etch gas is flowed into a processing chamber (step 204), wherein the etch gas comprises a fluorine containing component, helium, and a hydrofluorocarbon or a fluorocarbon component. In this example, the etch gas consists essentially of 50 sccm $SF_6$, 100 $CHF_3$, 700 sccm He. $CHF_3$ is the hydrofluorocarbon component. $SF_6$ is the fluorine containing component. The etch gas is formed into a plasma (step 208). Inductively coupled RF power is provided at 13.56 MHz with a power of 2600 Watts. A low bias of 50 volts is provided to cause ion bombardment from helium ions (step 212) to activate a surface of the stack for ion-assisted etching, wherein the in-situ plasma etches the activated surface of the stack. The etch process is stopped after 25 seconds (step 216). The etch process may be stopped by stopping the flow of the etch gas. In addition, the RF power may be stopped. If the RF power is used to provide trimming, then the RF power may continue. FIG. 3B is a cross-sectional view of the stack 300 after a stair-step has been ion-assisted etched in the stack. An exposed horizontal surface of the stack has been etched. In this example two bilayers of silicon oxide and silicon nitride are etched to form a first step 324.

Figure 3C:
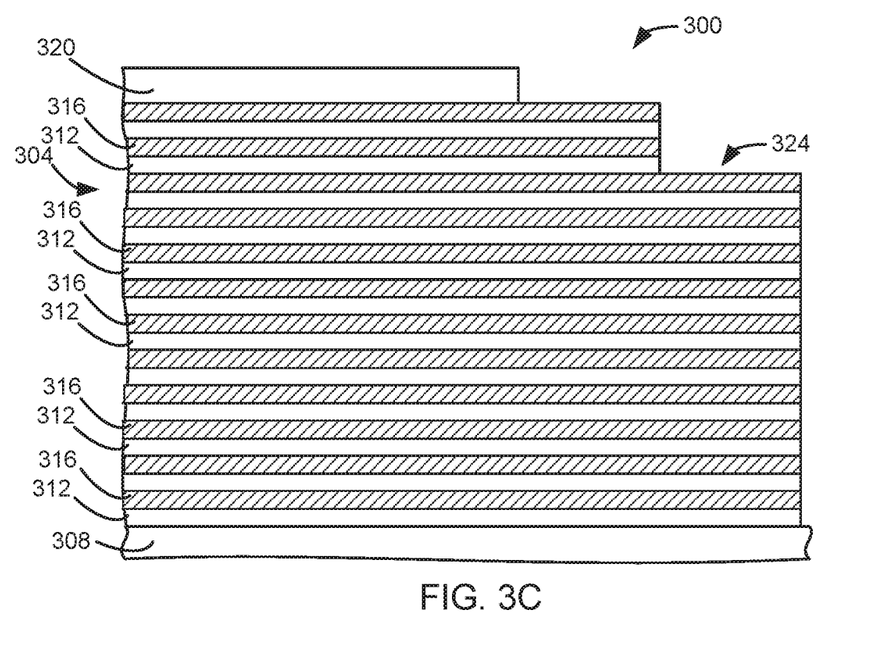
Figure 3D:
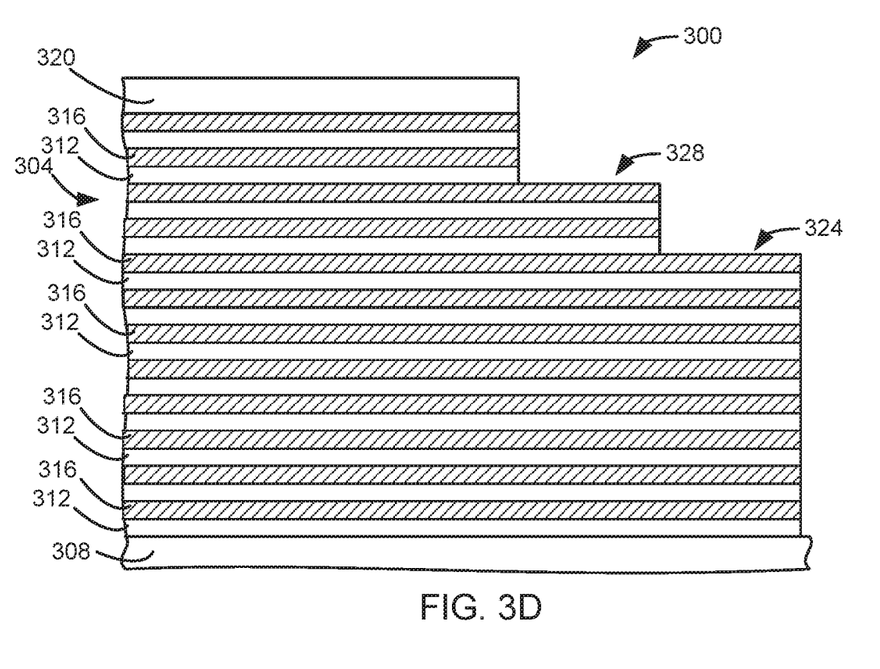

The organic mask is trimmed (step 112). An example of a recipe for the trim of the organic mask provides a pressure between 30 to 400 mTorr. A trim gas is flowed from the gas source 416 to the plasma chamber 404 (step 504), where the trimming gas is 1000 sccm $O_2$, 40 sccm $N_2$, and 50 sccm $NF_3$. The trimming gas is formed into a plasma. In this example, 1800 watts TCP power is provided at 13.56 MHz. 0 volts of bias is provided. The plasma is maintained for 20 to 60 seconds, and then the trimming gas is stopped. FIG. 3C is a cross-sectional view of the stack 300, after the organic mask 320 is trimmed If the stair is not complete (step 116), another stair-step is ion-assisted etched using the organic mask as a mask (step 108). The same recipe as the previous stair-step etch may be used. FIG. 3D is a cross-sectional view of the stack 300 after a stair-step has been etched. In this example two bilayers of silicon oxide and silicon nitride are etched to form a second step 328, while deepening the first step 324. The deepening of the first step 324 etches the first step, without using a mask and provides a vertical sidewall and a corner, without faceting.

Figure 3E:
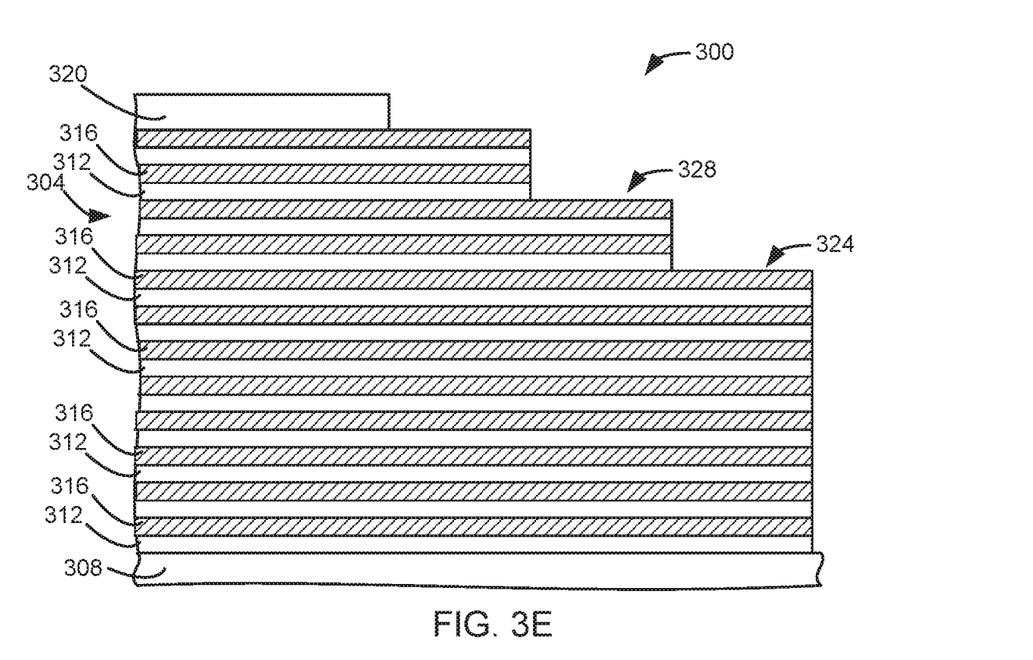

The organic mask 320 is trimmed again (step 112). The same trim recipe may be used. FIG. 3E is a cross-sectional view of the stack 300 after the organic mask 320 is trimmed (step 112).

Figure 3F:
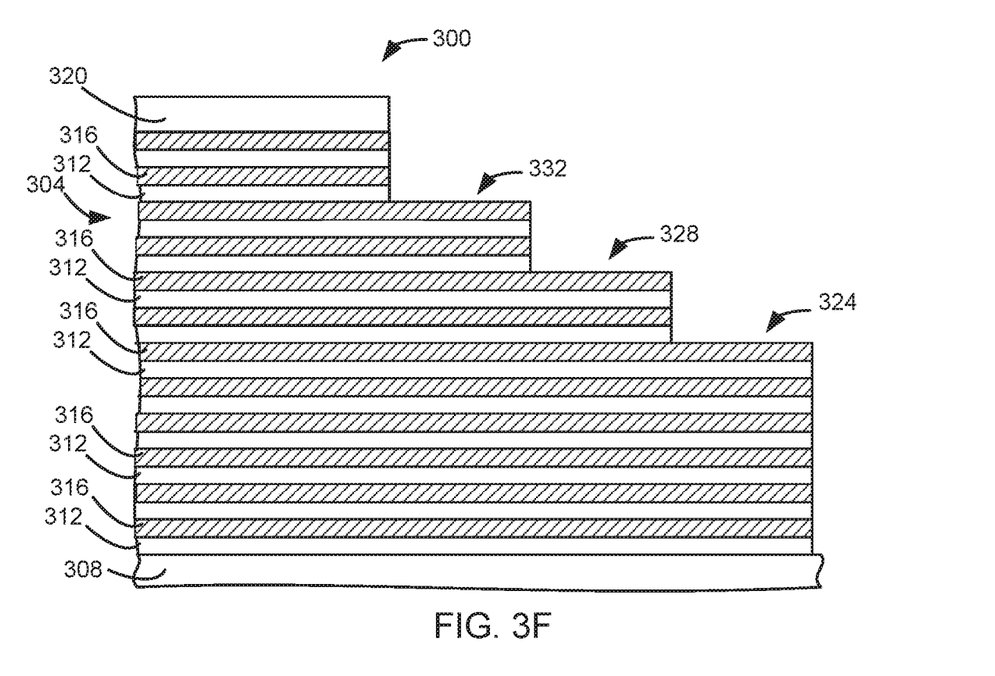

If the stair is not complete (step 116), another stair-step is ion-assisted etched using the organic mask as a mask (step 108). The same recipe as the previous stair-step etch may be used. FIG. 3F is a cross-sectional view of the stack 300 after a stair-step has been etched. In this example two bilayers of silicon oxide and silicon nitride are etched to form a third step 332, while deepening the second step 328 and the first step 324.

The process is continued until the stair is completed (step 116). The cycle is then stopped. Additional processes may be provided, such as removing the organic mask.

The completed stair provides an improved structure over stairs created using other processes in a manner that is faster than other processes. A feature about such a stair-step etch is that an unmasked region forming a step is etched. Other etch processes may depend on a chemical etching, which alternates between selectively etching silicon oxide with respect to silicon nitride and then selectively etching silicon nitride with respect to silicon oxide. Such an etch process would alternate etch gas chemistries and other parameters to alternate the selectivity. Such processes using alternating etches to selectively etch individual layers are slower than the above embodiment, which uses a single etch process to etch multiple individual layers with a single etch process. In addition, it is more difficult to control the vertical profile of such chemical etches, since a chemical etch would etch vertical surfaces in addition to horizontal surfaces. As a result, the resulting stair step structure would have a tapered profile. Such chemical etches of silicon oxide would use silicon nitride as a mask and etch stop. Such chemical etches of silicon nitride would use silicon oxide as a mask and etch stop. Other previous processes may rely on ion bombardment in order to etch silicon oxide and silicon nitride with a single etch process. Such ion bombardment tends to have some nonvertically directed ions. Such nonvertical ions cause sidewall loss. In addition, such bombardment may case faceting of the corners of the stair steps. Such faceting will also cause a tapered profile. Previous processes may add temporary masks to protect the sidewalls or organic mask. The formation of such masks further increase processing time.

The above embodiment provides an ion-assisted etch. Helium ions with a low bias voltage of 10 to 100 volts provides ion assistance to the etch, while avoiding ion bombardment damage caused by ion bombardment etching. Helium ions provide a low atomic weight to avoid ion bombardment damage. The bias voltage should be enough to activate the surface without any additional damage or faceting at the corners of the stairs. Preferably, the bias voltage allows the helium ions to activate the surface of the stack without etching the stack. Instead, the plasma chemically etches the activated surfaces of the stack. The flow rates of the fluorine containing component and the hydrofluorocarbon or hydrocarbon may be used as control parameters to provide the desired etch while providing sufficient passivation to prevent sidewall damage and faceting, while performing the ion-assisted etch. The ion-assist allows the etching of both the silicon oxide and silicon nitride, using a single etch process. The embodiment provides a stair-step structure with vertical sidewalls or sidewalls with a reduced slope. The above embodiment has been found to provide an etch process that is twice as fast as a baseline chemical etch process that alternates between selective etch chemistries. In addition, the above embodiment has been found to more selectively etch ONON layers with respect to the organic mask and help to improve the L/V ratio, which is the lateral organic mask trim to vertical organic mask height loss ratio. It was found that the above embodiment was able to etch in about 30 seconds 3 pairs of silicon oxide/silicon nitride bilayers with a total thickness of 170 nm, compared to a conventional chemical etch using two alternating etch recipes, which took about 60 seconds. Therefore, the above embodiment was about twice as fast as a previous etch process. The above embodiment was found to have a vertical profile of greater than 85°, whereas a conventional chemical etch using two alternating etch recipes had a vertical profile of less than 80°. In the specification and claims, a vertical profile is defined as having a profile of greater than 85° from the horizon. Since this embodiment provides an ion-assisted etch, only areas activated by ion-assist are chemically etched. As a result, sidewall etching is reduced without requiring a protective sidewall layer. Therefore, during the etch process the stair-step structure does not have a mask over some steps and sidewalls of the steps.

In addition, the above embodiment provides a single etch process with approximately a 1 to 1 selectivity between etching the silicon oxide and silicon nitride. This causes the silicon oxide to be etched about as fast as the silicon nitride. In such a single step process for etching multiple layers of silicon oxide and silicon nitride, it is desirable to etch both the silicon oxide and silicon nitride at the same rate.

Preferably, the fluorine containing component is $SF_6$ or $NF_3$, which acts as the main etchant for etching SiN. Preferably, the hydrofluorocarbon or fluorocarbon is $CHF_3$ or $CF_4$, which acts as the main etchant for etching silicon oxide. It has been found that the correct balance of these two etchants combined with ion-assist can stop lateral chemical etching. With a large He dilution, the majority of ions are from He. Preferably, the flow rate of He is at least twice the flow rate of the remaining components of the etch gas, measured by volume flow rate (sccm). The flow rate of the remaining components of the etch gas equals the flow rate of the etch gas minus the flow rate of the helium. More preferably, the flow rate of He is at least four times the flow rate of the remaining components of the etch gas. Preferably, the low bias voltage is between 10 to 100 volts. More preferably, the low bias voltage is between 20 to 70 volts. Preferably, the etch is at a low pressure of between 5 to 20 mTorr, to reduce inter ions collisions, resulting in a higher percentage of vertical ions.

Preferably, the cycle is repeated at least 5 times, so that at least five stair-steps are provided. More preferably, at least 8 stair-steps may be provided. The stair-steps may be formed in one or more horizontal directions (X or Y) in other embodiments.

In other embodiments, other feature shapes may be etched into a plurality of silicon oxide and silicon nitride bilayers with a single ion-assisted etch process. The ion-assisted etch process would reduce corner faceting and sidewall etching on non-stair step structures, while increasing the etch rate of the bilayers.

In other embodiments, the first layer is a silicon nitride layer. In other embodiments, the last step is an etch step, wherein the organic layer is not subsequently trimmed after the last etch step. In some embodiments, the ion-assisted etch may be used to etch high aspect ratio features, such as contacts.

In some embodiments, the etch gas consists essentially of a fluorine component, helium, and a fluorohydrocarbon or hydrocarbon. In other embodiment the etch gas comprises a fluorine component, helium, and a fluorohydrocarbon or hydrocarbon with the addition of one or more of HBr, COS, $Cl_2$, $N_2$, Ar, $H_2$, or $SiCl_4$. For example, in one embodiment the etch gas consists essentially of a fluorine component, helium, HBr, COS, and a fluorohydrocarbon or hydrocarbon. In another embodiment the etch gas consists essentially of a fluorine component, helium, HBr or COS, and a fluorohydrocarbon or hydrocarbon.

In an embodiment, the stack comprises at least two pairs of bilayers of silicon oxide and silicon nitride. In another embodiment, the stack comprises at least 100 pairs of bilayers of silicon oxide and silicon nitride.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for ion-assisted etching a stack of alternating silicon oxide and silicon nitride layers in an etch chamber, comprising:
    flowing an etch gas comprising a fluorine component, helium, and a fluorohydrocarbon or hydrocarbon into the etch chamber;
    forming the etch gas into an in-situ plasma in the etch chamber; and
    providing a bias of about 10 to about 100 volts to accelerate helium ions to the stack and activate a surface of the stack to form an activated surface for ion-assisted etching, wherein the in-situ plasma etches the activated surface of the stack.

2. The method, as recited in claim 1, wherein a flow rate of helium of the etch gas is at least twice a flow rate of remaining components of the etch gas.

3. The method, as recited in claim 1, wherein the stack comprises at least two pairs of bilayers of silicon oxide and silicon nitride.

4. The method, as recited in claim 1, wherein the stack comprises at least 100 pairs of bilayers of silicon oxide and silicon nitride.

5. The method, as recited in claim 1, wherein the forming the etch gas into an in-situ plasma comprises providing RF power to the etch chamber through inductive coupling.

6. The method, as recited in claim 1, wherein the stack is in a form of a stair-step structure, wherein the stair-step structure has a mask over part of the stack, wherein the mask does not cover some steps and sidewalls of the steps.

7. The method, as recited in claim 1, wherein the stack is disposed below an organic mask, and the method further comprising trimming the organic mask.

8. The method, as recited in claim 1, wherein the etch gas further comprises at least one of HBr, COS, $Cl_2$, $N_2$, Ar, $H_2$, or $SiCl_4$.

9. The method, as recited in claim 1, wherein the helium ions do not etch the stack and wherein the in-situ plasma chemically etches only the activated surface of the stack.

10. A method for forming a stair-step structure in a stack in a plasma processing chamber, wherein the stack has an organic mask and wherein the stack comprises a plurality of bilayers of silicon oxide and silicon nitride, comprising a plurality of cycles, wherein each cycle comprises:
    a) trimming the organic mask; and
    b) ion-assisted etching at least one complete bilayer of the stack, wherein the ion-assisted etching comprises:
        flowing an etch gas comprising a fluorine component, helium, and a fluorohydrocarbon or hydrocarbon into an etch chamber;
        forming the etch gas into an in-situ plasma in the etch chamber; and
        providing a bias of about 10 to about 100 volts to accelerate helium ions to the stack in the etch chamber and activate a surface of the stack to form an activated surface of the stack, wherein the in-situ plasma etches the activated surface of the stack.

11. The method, as recited in claim 10, wherein the cycle of steps a-b is repeated at least 5 times.

12. The method, as recited in claim 10, wherein the organic mask is a photoresist mask.

13. The method, as recited in claim 10, wherein steps a-b are performed in an inductively coupled plasma processing chamber.

14. The method, as recited in claim 10, wherein a flow rate of helium of the etch gas is at least twice a flow rate of remaining components of the etch gas.

15. The method, as recited in claim 10, wherein the helium ions do not etch the stack and wherein the in-situ plasma chemically etches only the activated surface of the stack.

16. The method, as recited in claim 10, wherein the etch gas further comprises at least one of HBr, COS, $Cl_2$, $N_2$, Ar, $H_2$, or $SiCl_4$.

* * * * *